(12) United States Patent
Jo

(10) Patent No.: US 11,067,636 B2
(45) Date of Patent: Jul. 20, 2021

(54) BATTERY AGING STATE CALCULATION METHOD AND SYSTEM

(71) Applicant: LG Chem, Ltd., Seoul (KR)

(72) Inventor: Young Chang Jo, Seoul (KR)

(73) Assignee: LG Chem, Ltd.

( * ) Notice: Subject to any disclaimer, the term of this patent is extended or adjusted under 35 U.S.C. 154(b) by 449 days.

(21) Appl. No.: 15/815,240

(22) Filed: Nov. 16, 2017

(65) Prior Publication Data

US 2018/0149709 A1   May 31, 2018

(30) Foreign Application Priority Data

Nov. 29, 2016   (KR) .......................... 10-2016-0160331

(51) Int. Cl.
| | | |
|---|---|---|
| *H02J 7/00* | (2006.01) | |
| *H02J 7/14* | (2006.01) | |
| *G01R 31/392* | (2019.01) | |
| *G01R 31/36* | (2020.01) | |
| *G01R 31/389* | (2019.01) | |

(52) U.S. Cl.
CPC ....... *G01R 31/392* (2019.01); *G01R 31/3648* (2013.01); *G01R 31/389* (2019.01)

(58) Field of Classification Search
USPC ....................................................... 320/132
See application file for complete search history.

(56) References Cited

U.S. PATENT DOCUMENTS

| | | | | |
|---|---|---|---|---|
| 8,907,631 | B1 * | 12/2014 | Gurries | H02J 7/00712 320/138 |
| 9,063,018 | B1 * | 6/2015 | Ghantous | H02J 7/00 |
| 2006/0202857 | A1 * | 9/2006 | Kawahara | G01R 31/3648 340/870.02 |
| 2007/0299620 | A1 * | 12/2007 | Yun | G01R 31/3842 702/63 |
| 2008/0103709 | A1 * | 5/2008 | Yun | G01R 31/389 702/63 |
| 2011/0089907 | A1 * | 4/2011 | Bhardwaj | H02J 7/00 320/136 |
| 2012/0112700 | A1 * | 5/2012 | Morimoto | H02J 7/0072 320/132 |
| 2012/0119749 | A1 * | 5/2012 | Iida | H01M 10/441 324/435 |
| 2012/0200266 | A1 * | 8/2012 | Berkowitz | H02J 7/0021 320/139 |
| 2015/0120225 | A1 * | 4/2015 | Kim | G01R 31/392 702/63 |
| 2015/0377976 | A1 * | 12/2015 | Maluf | G01R 31/392 702/63 |

(Continued)

FOREIGN PATENT DOCUMENTS

| | | |
|---|---|---|
| JP | 2013142630 A | 7/2013 |
| KR | 101509001 B1 | 4/2015 |
| KR | 2016-85529 A | 7/2016 |

*Primary Examiner* — Alexis B Pacheco
(74) *Attorney, Agent, or Firm* — Lerner, David, Littenberg, Krumholz & Mentlik, LLP

(57) ABSTRACT

The present disclosure relates to a UPS battery aging state calculation method and system, and more specifically, to an aging state calculation method and system of a UPS battery for accurately calculating an aging state (i.e., State of Health (SOH)) of the UPS battery itself by repeatedly executing the charge and self-discharge of the UPS battery through a switch.

8 Claims, 4 Drawing Sheets

(56) References Cited

U.S. PATENT DOCUMENTS

| | | | |
|---|---|---|---|
| 2016/0003912 A1* | 1/2016 | Iwane | H02J 7/0021 |
| | | | 702/63 |
| 2016/0036096 A1* | 2/2016 | Yoshida | H01M 10/482 |
| | | | 429/50 |
| 2016/0131719 A1* | 5/2016 | Takahashi | G01R 31/392 |
| | | | 324/430 |
| 2016/0327613 A1* | 11/2016 | Tenmyo | G01R 31/367 |
| 2017/0093207 A1* | 3/2017 | Park | H02J 9/062 |
| 2017/0126054 A1* | 5/2017 | White | H05K 7/1498 |
| 2017/0160349 A1* | 6/2017 | Iida | G01R 31/36 |
| 2017/0350946 A1* | 12/2017 | Mukaitani | H01M 2/1077 |
| 2019/0036356 A1* | 1/2019 | Subbaraman | H02J 7/0021 |
| 2019/0212391 A1* | 7/2019 | Koller | G01R 31/3647 |

* cited by examiner

BATTERY AGING STATE CALCULATION METHOD AND SYSTEM

CROSS-REFERENCE TO RELATED APPLICATION

This application claims priority to Korean Patent Application No. 10-2016-0160331 filed on Nov. 29, 2016 and all the benefits accruing therefrom under 35 U.S.C. § 119, the contents of which are incorporated by reference in their entirety.

BACKGROUND

The present disclosure relates to a UPS battery aging state calculation method and system, and more specifically, to an aging state calculation method and system of a UPS battery for accurately calculating an aging state (i.e., State of Health (SOH)) of the UPS battery itself by repeatedly executing the charge and self-discharge of the UPS battery through a switch.

A UPS is an abbreviation of Uninterruptible Power Supply, and as a power device that normally keeps a battery in a fully charged state by receiving the commercial power or the generator power and when the power is lost, discharges the battery in order to continuously supply electricity to the load for a predetermined time without momentary power failure, is a device that always supplies the rated voltage and the rated frequency electricity to the load even if the voltage fluctuation and frequency fluctuation of the input power occur.

Generally, a Li-ion battery is used for a UPS device. The lithium ion battery is formed by assembling a plurality of unit secondary battery cells, and a battery management system (BMS) is configured therein, so that charge or discharge of the battery can be efficiently controlled.

When charge or discharge is repeated in the battery, the chemical materials inside the battery undergo chemical degenerations, or the electrical structures or the mechanical characteristics are deformed, so that the battery is aged. Also, if the aging process is continued, the lifetime of the battery will be lowered gradually compared to the initial lifetime, and will be shortened at the end.

Therefore, in many systems using a battery, since it is very important for the stable operation of the system to estimate the function degradation and when to replace the battery due to aging, the maintenance of the remaining battery lifetime is necessary, and to this end, accurate battery lifetime prediction is very important.

There are generally two methods of predicting such a lifetime (e.g., SOH). The first method is to calculate a current capacity (Ah) by accumulating a current until fully discharged after fully charging a battery and then calculating the ratio of the current capacity to an initial capacity (Ah), and the second method is to check an increase in a resistance component of a battery by measuring DCIR through full or sample inspections as periodically investing the maintenance personnel of a battery company (different for each battery company such as 6 months or 1 year).

In addition, LG Chemical has used a method of calculating an SOH value for a corresponding date by individually finding changes in life expectancy (e.g., SOH) according to the number of days stored through testing and accumulating the archiving dates.

However, the second method is mainly used for a lead-acid battery system and the first method is generally used for a lithium ion battery. In the first method, a test is possible before normal operation after production, but it is difficult to perform a test in an actual system in operation.

In addition, the SOH calculation method of the LG Chemical described above is less accurate because the storage conditions and the usage conditions are different for each region where the battery is located.

Also, the conventional BMS of the UPS battery system cannot control the charge/discharge of the UPS battery arbitrarily, and typical life expectancy (e.g., SOH) can be calculated when a battery is charged or discharged so that it is difficult to calculate an SOH based on the property of the UPS waiting at the target voltage in a floating charge state. Also, it is difficult to calculate an SOH through the conventional method since the UPS installed in the area where the power failure does not occur is not used until the battery is discarded.

Therefore, technology development is required to enable charge/discharge control in a floating charge state of an operating UPS battery so that the SOH can be accurately calculated.

PRIOR ART DOCUMENTS

Patent Documents (Patent Document 1) KR10-2016-0085529 A

SUMMARY

The present disclosure provides a UPS battery aging state calculation method and system for accurately calculating an SOH of a battery applied to an operating UPS.

In accordance with an exemplary embodiment, a method of calculating an aging state (i.e., State of Health (SOH)) of a battery mounted on an Uninterruptible Power Supply (UPS) includes: a charge/discharge execution operation for executing charge and discharge of the battery to measure a current, a voltage, and a temperature, and counting the number of charge/discharge executions; and when the number of charge/discharge executions counted in the charge/discharge execution operation exceeds a predetermined reference value, an SOH calculation operation for calculating an SOH using a battery capacity at initial shipment, a change amount in a State of Charge (SOC), and a current amount accumulated at charge or discharge, wherein when the number of charge/discharge executions counted in the charge/discharge execution operation does not exceed the predetermined reference value, the charge/discharge execution operation is repeated.

The charge/discharge execution operation may include: a charge execution operation for executing charge until a full charge state is reached; and if the battery is fully charged in the charge execution operation, a discharge execution operation for executing self-discharge.

The charge execution operation may include: a switch on operation for turning on a switch for supplying a current from a current supply unit to the battery; a charge SOC calculation operation for calculating a charge SOC based on the current, voltage, and temperature supplied from the switch on operation; and a charge SOC comparison operation for comparing the charge SOC calculated in the charge SOC calculation operation with a full charge reference value.

When the charge SOC calculated in the charge SOC calculation operation is greater than the full charge reference value, the discharge execution operation may be executed.

The discharge execution operation may include: a switch off operation for turning off a current supply switch when the battery is fully charged in the charge execution operation; a discharge SOC calculation operation for calculating a discharge SOC based on a current, a voltage, and a temperature when self-discharge is executed; and a discharge SOC comparison operation for comparing the discharge SOC calculated in the discharge SOC calculation operation with a predetermined discharge reference value.

When the discharge SOC calculated in the discharge SOC calculation operation is less than the predetermined discharge reference value, a charged or discharged current may be accumulated.

The change amount of the SOC of the SOH calculation operation and the accumulated current amount may use the same value of the charge or discharge state.

The change amount of the SOC of the SOH calculation operation and the accumulated current amount may calculate an SOH by individually summing each accumulated value the number of charge/discharge executions.

In accordance with another exemplary embodiment, a system of calculating an aging state (i.e., State of Health (SOH)) of a battery mounted on an Uninterruptible Power Supply (UPS) includes: a current supply unit as a current source; a switch configured to turn on/off a current of the current supply unit supplied to the battery; and a control unit configured to control the on/off of the switch and calculate an SOH of the battery based on a current, a voltage, and a temperature at charge or discharge, wherein the control unit periodically turns on the switch to execute charge of the battery, and when the battery is fully charged, executes self-discharge of the battery to turn off the switch.

The control unit may include: a signal output unit configured to output an on/off control signal of the switch; an SOC calculation unit configured to calculate a charge SOC and a discharge SOC based on a charged and discharged current, voltage, and temperature; a counter configured to count the number of times charge/discharge is executed; a comparison unit configured to compare the charge SOC and the discharge SOC calculated in the SOC calculation unit, and the number of executions of the counter with respective predetermined reference values, a current accumulation unit configured to accumulate a current during a charge or discharge period when the discharge SOC is compared to be less than a predetermined discharge reference value in the comparison unit; and an SOH calculation unit configured to calculate an SOH based on the current accumulated in the current accumulation unit when the comparison unit determines that the number of charge/discharge executions exceeds a predetermined reference value.

The battery may include a battery BMS and a power of the battery consumed at discharge may be used as a BMS power of the battery.

The SOH calculation unit may sum up accumulation currents accumulated the number of charge/discharge executions to calculate an SOH.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, embodiments of the present disclosure will be described in more detail with reference to contents in the accompanying drawings. However, the present disclosure is not limited or restricted by embodiments. Only, the technical spirit of the inventive concept is disclosed to the full through the description of the embodiments, and it is provided to those skilled in the art that the inventive concept belongs to inform the scope of the inventive concept completely.

Although the terms "first," "second," etc., may be used herein to describe various elements, these elements should not be limited by these terms. The above terms are used only to distinguish one component from another. For example, a first component may be referred to as a second component and vice versa without departing from the scope of the present disclosure. Terms used in this specification are used to describe specific embodiments, and are not intended to limit the scope of the present disclosure. The singular expressions include plural expressions unless the context clearly dictates otherwise.

Terms used in this specification may be currently widely used general terms in consideration of functions in the present disclosure but may vary according to the intents of those skilled in the art, precedents, or the advent of new technology. Additionally, in certain cases, there may be terms the applicant selects arbitrarily and in this case, their meanings are described in a corresponding description part of the present disclosure. Accordingly, terms used in the present disclosure should be defined based on the meaning of the term and the entire contents of the present disclosure instead of the simple term name.

Embodiment 1

Next, a UPS battery aging state calculation method according to an embodiment of the present disclosure will be described.

The UPS battery aging state calculation method of the present disclosure controls a switch to execute charge and discharge and repeatedly executes measuring a current, a voltage and a temperature at discharge to calculate a State of Health (SOH) so that it calculates the aging state of the UPS battery accurately by itself.

Figure 1:
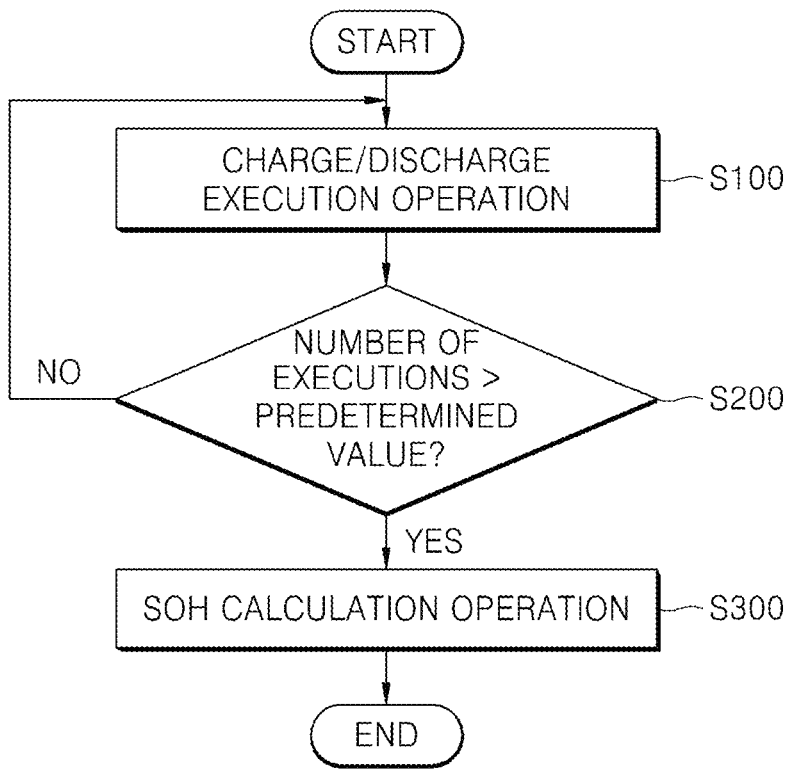
FIG. 1 is a flowchart of a UPS battery aging state calculation method according to an embodiment of the present disclosure.

FIG. 1 is a flowchart of a UPS battery aging state calculation method according to an embodiment of the present disclosure.

Referring to FIG. 1, a UPS battery aging state calculation method according to an embodiment of present disclosure executes charge and discharge of a battery to measure a current, a voltage, and a temperature, and counts the number of charge/discharge executions (charge/discharge execution operation: S100).

When the number of charge/discharge executions counted in the charge/discharge execution operation (S100) exceeds a predetermined reference value (S200), an SOH is calculated using the battery capacity at initial shipment, a change amount in SOC, and a current amount accumulated at charge or discharge (SOH calculation operation: S300).

In addition, when the number of charge/discharge executions counted in the charge/discharge execution operation (S100) does not exceed the predetermined reference value (S200), the charge/discharge execution operation (S100) is repeated.

Here, the predetermined value is the number of times charge and discharge are repeated so that a current, a voltage, and a temperature are accumulated so as to calculate an accurate SOH, and is set to 10 as one embodiment, but is not limited thereto.

In addition, the charge/discharge execution operation (S100) will be described in detail with reference to FIGS. 2, 3, and 4.

Figure 2:
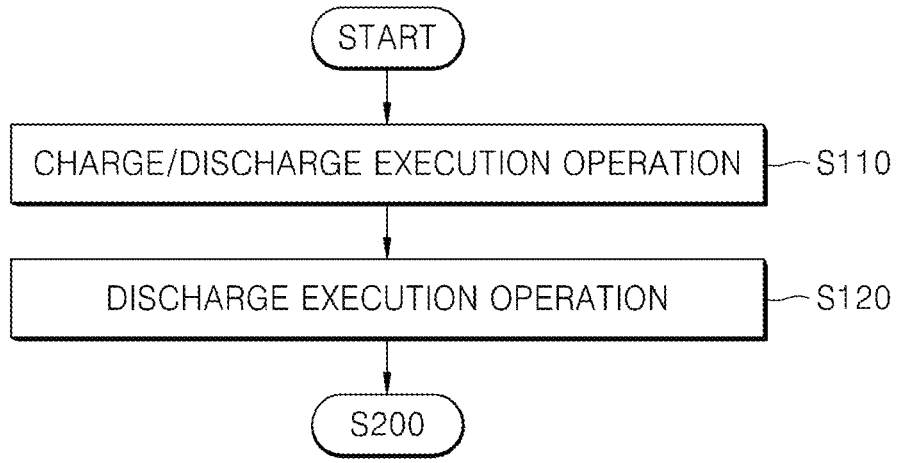
FIG. 2 is a flowchart of a charge/discharge execution operation in a UPS battery aging state calculation method according to an embodiment of the present disclosure.

FIG. 2 is a flowchart of a charge/discharge execution operation in a UPS battery aging state calculation method according to an embodiment of the present disclosure.

Referring to FIG. 2, charge is executed until a full charge state is reached (charge execution operation: S110) and if only the battery is fully charged in the charge execution operation (S110), self-discharge is executed (discharge execution operation: S120).

Figure 3:
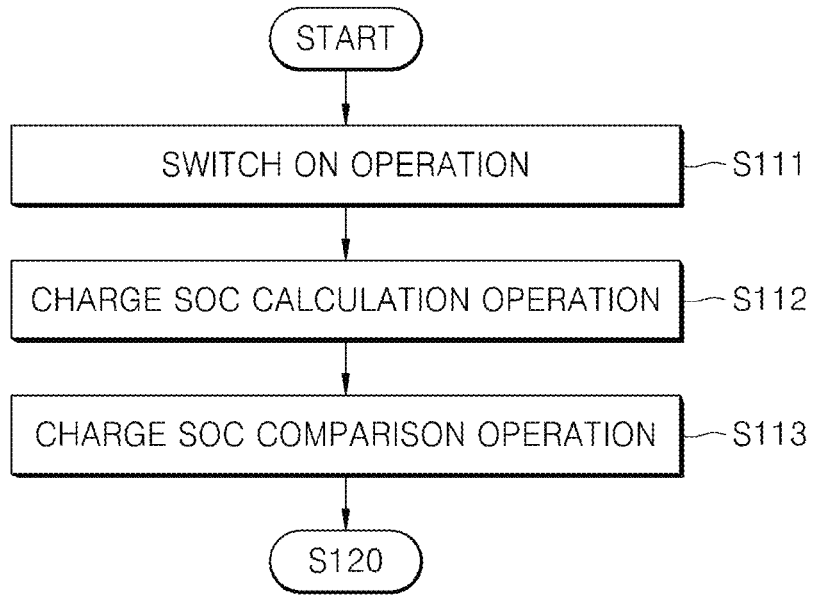
FIG. 3 is a flowchart of a charge execution operation in a charge/discharge execution operation according to an embodiment of the present disclosure.

In addition, FIG. 3 is a flowchart of a charge execution operation in a charge/discharge execution operation according to an embodiment of the present disclosure.

Referring to FIG. 3, the charge execution operation (S110) turns on a switch for supplying current from the current supply unit to the battery (switch on operation: S111) and calculates a charge SOC based on the current, voltage, and temperature supplied from the switch on operation (S111) (charge SOC calculation operation: S112).

Here, an SOC is calculated using a lookup table or function determined according to a current, a voltage, and a temperature.

If the charge SOC calculated in the charge SOC calculation operation (S112) is compared with a full charge reference value (charge SOC comparison operation: S113) and as a result, the charge SOC is equal to or greater than the full charge reference value, the discharge execution operation (S120) is executed.

Also, the charge SOC calculation operation (S112) calculates a charge estimate time based on a pre-stored general time that becomes a full charge state from a full discharge state, and calculates a charge SOC after the calculated charge estimate time. If the charge SOC is less than the predetermined full charge reference value as a result of the comparison of the charge SOC comparison operation (S113), the charge SOC calculation operation (S112) and the charge SOC comparison operation (S113) are repeatedly executed at predetermined time intervals. Here, the predetermined time interval means a value set by a user.

Also, the full charge reference value is 100% because it is a criterion of full charge.

Figure 4:
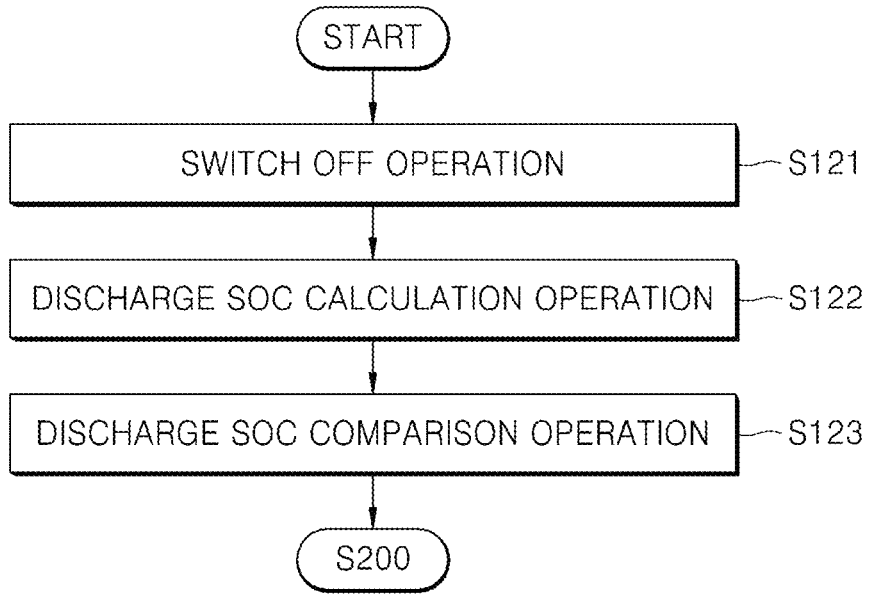
FIG. 4 is a flowchart of a discharge execution operation in a charge/discharge execution operation according to an embodiment of the present disclosure.

In addition, FIG. 4 is a flowchart of a discharge execution operation in a charge/discharge execution operation according to an embodiment of the present disclosure.

Referring to FIG. 4, the discharge execution operation (S120) turns off a switch for supplying current to a battery (switch off operation: S121) when the battery is fully charged in the charge execution operation (S110). Then, since the battery itself consumes current, a discharge SOC is calculated based on a current, voltage, and temperature consumed according thereto (discharge SOC calculation operation: S122).

Also, the discharge SOC calculated in the discharge SOC calculation operation (S122) is compared with a predetermined discharge reference value (discharge SOC comparison operation: S123), and if the discharge SOC compared in the discharge SOC comparison operation (S123) is less than the predetermined discharge reference value, the charge execution operation (S110) accumulates the charge or discharge current of the corresponding battery and executes the SOH calculation operation (S300).

Also, the discharge SOC calculation operation (S122) obtains a time in advance, which is the predetermined discharge reference value in a full charge state when self-discharge is executed through a test, and as it is pre-stored, calculates a discharge SOC based on the obtained time.

In addition, it is possible to calculate a discharge SOC as a time that is less than the time obtained from the previous test so as to obtain the discharge specification (which can supply a current of the UPS battery for a predetermined time) that the UPS battery has.

If the discharge SOC is greater than the predetermined full discharge reference value as a result of the comparison of the discharge SOC comparison operation (S123), the discharge SOC calculation operation (S122) and the discharge SOC comparison operation (S123) are repeatedly executed at regular time intervals. Here, the predetermined time interval means a value set by a user.

In addition, the predetermined discharge reference value generally refers to a capacity value having a predetermined size of the degree that discharge is executed instead of that a small amount of capacity is reduced like self-discharge and is set to 95(%) in one embodiment.

Furthermore, a method of calculating an SOH in the SOH calculation operation (S300) will be described in detail below.

(Equation 1) is a general SOH calculation method.

$$SOH[\%] = (\int d\ t)/(\text{Initial Capacity}) \times 100[\%] \quad \text{(Equation 1)}$$

Herein, Initial Capacity is the capacity [Ah] of the initially shipped battery, and $\int i\ dt$ is the accumulated current amount [Ah] while the battery is charged from a full discharge state to a full charge state.

On the other hand, in the SOH calculation operation (S300), an SOH is calculated by using (Equation 2) modified from (Equation 1).

$$SOH[\%] = \{(\Delta \int i\ dt)/(\text{Initial Capacity} \times \Delta SOC \times 0.01)\} \times 100[\%] \quad \text{(Equation 2)}$$

Herein, $\Delta SOC$ is the change amount of an SOC when charge or discharge is executed and the absolute value is used. Also, $\Delta \int i\ dt$ is the accumulated current amount during charge or discharge execution, and $\Delta SOC$ and $\Delta \int i\ dt$ in the SOH calculation should use the values calculated in the same state (charge or discharge).

Also, in order to increase the accuracy of an SOH value in SOH calculation, an SOH is calculated by using the sum of $\Delta SOC$ and $\Delta \int i\ dt$, which are individually accumulated a number of times of a predetermined value.

For example, when charge/discharge is executed five times and respective $\Delta SOC$ are 5[%], 6[%], 6[%], 4[%], and 6[%], $\Delta SOC$ becomes 27(%) during SOH calculation.

In addition, when respective $\Delta f_i$ dt are 0.4[Ah], 0.4[Ah], 0.4[Ah], 0.6[Ah], and 0.5[Ah], $\Delta f_i$ dt becomes 2.3[Ah] during SOH calculation.

Therefore, when the initially-shipped battery capacity is 10 [Ah], an SOH may be calculated as 85% and the aging state of the battery may be considered to be good.

Embodiment 2

Next, a UPS battery aging state calculation system according to an embodiment of the present disclosure will be described.

The UPS battery aging state calculation system of the present disclosure charges/discharges a battery repeatedly a predetermined number of times by turning a switch on and off, calculates an accurate SOH by itself using the current, voltage and temperature obtained during charge/discharge execution.

Figure 5:
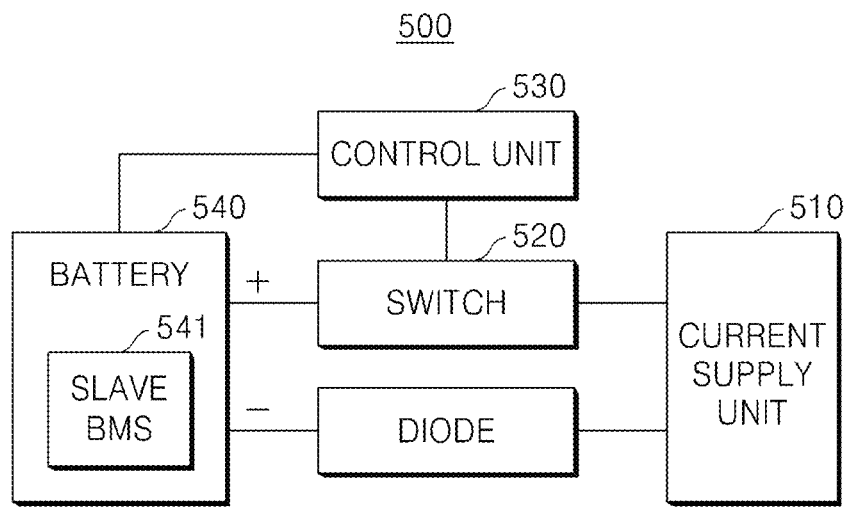
FIG. 5 is a block diagram of a UPS battery aging state calculation system according to an embodiment of the present disclosure.

FIG. 5 is a block diagram of a UPS battery aging state calculation system according to an embodiment of the present disclosure.

Referring to FIG. 5, an aging state calculation system 500 of a battery 540 mounted on a UPS according to an embodiment of the present disclosure includes a current supply unit 510 as a current source, a switch 520 for turning on/off a current of the current supply unit 510 supplied to the battery 540, and a control unit 530 for controlling on/off of the switch 520 and calculating an SOH of the battery 540 to allow charge/discharge to be executed.

Here, the UPS battery aging state calculation system 500 further includes a diode (not shown) so that discharge can be executed even in a state where the switch 520 is off. The diode (not shown) may be connected in parallel with the switch 520 to be individually connected to the battery 540 and the current supply unit 510.

The UPS battery aging state calculation system 500 having such a structure generally allows the UPS, which is generally in a floating charge state, to execute charge/discharge.

In addition, the control unit 530 is configured in a Master BMS (not shown), and the battery includes a slave BMS 541.

In addition, the control unit 530 will be described in detail below with reference to FIG. 6.

Figure 6:
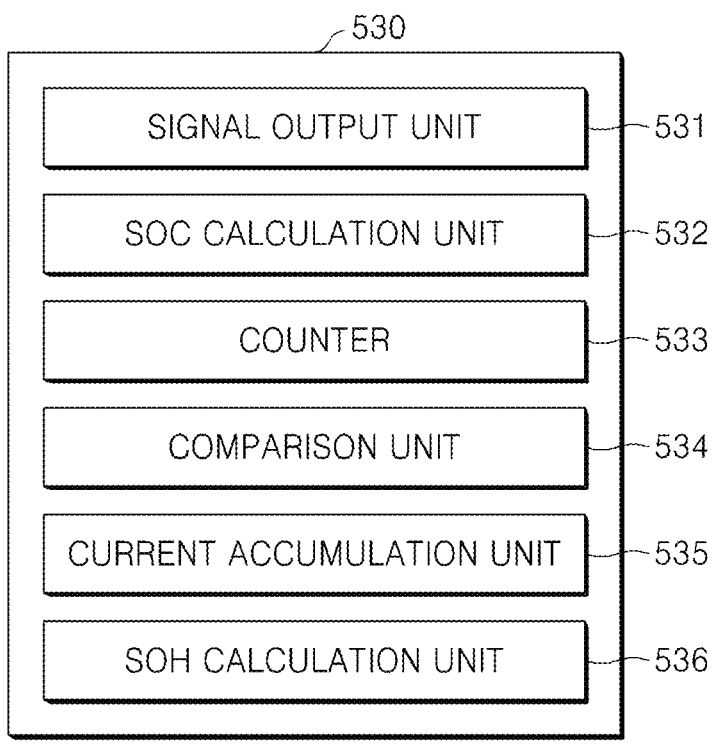
FIG. 6 is a block diagram of a control unit in a UPS battery aging state calculation system according to an embodiment of the present disclosure.

FIG. 6 is a block diagram of a control unit in a UPS battery aging state calculation system according to an embodiment of the present disclosure.

The control unit 530 includes a signal output unit 531 for outputting an on/off control signal of the switch 520, an SOC calculation unit 532 for calculating a charge SOC and a discharge SOC based on a charged and discharged current, voltage, and temperature, a counter 533 for counting the number of times charge/discharge is executed, a comparison unit 534 for comparing the charge SOC and the discharge SOC calculated in the SOC calculation unit 532, and the number of executions of the counter with respective predetermined reference values, a current accumulation unit 535 for accumulating a current during a charge or discharge period when the discharge SOC is compared to be less than a predetermined discharge reference value in the comparison unit 534, and an SOH calculation unit 536 for calculating an SOH based on the current accumulated in the current accumulation unit 535 when the comparison unit 534 determines that the number of execution times exceeds a predetermined reference value.

Here, the SOH calculation unit 536 calculates an SOH using (Equation 2) above.

In addition, the time of executing charge and discharge is additionally calculated in the control unit 530.

Hereinafter, a driving method of the UPS battery aging state calculation system will be described in more detail below.

The UPS battery aging state calculation system 500 periodically calculates an SOH. The signal output unit 530 outputs a signal for controlling the switch 520 to be turned on and transmits the signal to the switch 520 according to the priority period.

The switch 520 receiving the on signal is turned on to transfer the current from the current supply unit 510 to the battery 540.

Depending on the charge estimate time separately calculated in the control unit 530, the SOC calculation unit 532 calculates a charge SOC and the calculated charge SOC is compared with a predetermined full charge reference value through the comparison unit 534.

If the charge SOC is equal to or greater than a predetermined full charge reference value, the signal output unit 530 outputs a signal for controlling off of the switch 520 and transmits the signal to the switch 520.

The switch 520 receiving the off signal is turned off and the battery 540 consumes only a small amount of current for driving the slave BMS 541.

The SOC calculation unit 532 calculates the discharge SOC based on the current, voltage, and temperature consumed through the self-discharge, and compares the discharge SOC and the predetermined discharge reference value through the comparison unit 534. Here, the current, voltage, and temperature at the time of charge and discharge execution are measured by the slave BMS 541 and transmitted to the SOC calculation unit 532.

When the discharge SOC is compared to be less than the predetermined discharge reference value in the comparison unit 534, the charged or discharged current is accumulated in the current accumulation unit 535, and the number of charges/discharges is counted through the counter 533. Here, the number of times the counter 533 counts can count the number of charge/discharge times and also the number of times the current is accumulated.

The comparison unit 534 compares the number times counted by the counter 533 to a predetermined reference value, and the SOH calculation unit 536 calculates an SOH based on the current accumulated in the current accumulation unit 535, the battery capacity at the time of initial shipment, and the SOC change amount at charge or discharge execution.

Here, the current accumulation value and the SOC change amount are the respective sums of the respective current accumulation values and SOC change amounts at the time of charge or discharge, which is executed by the counted number of times. If an SOH is calculated with a very small value, the accuracy is lower than that of the conventional method, so charge/discharge is repeatedly executed and an error of an SOH value is minimized by accumulating the values.

Figure 7:
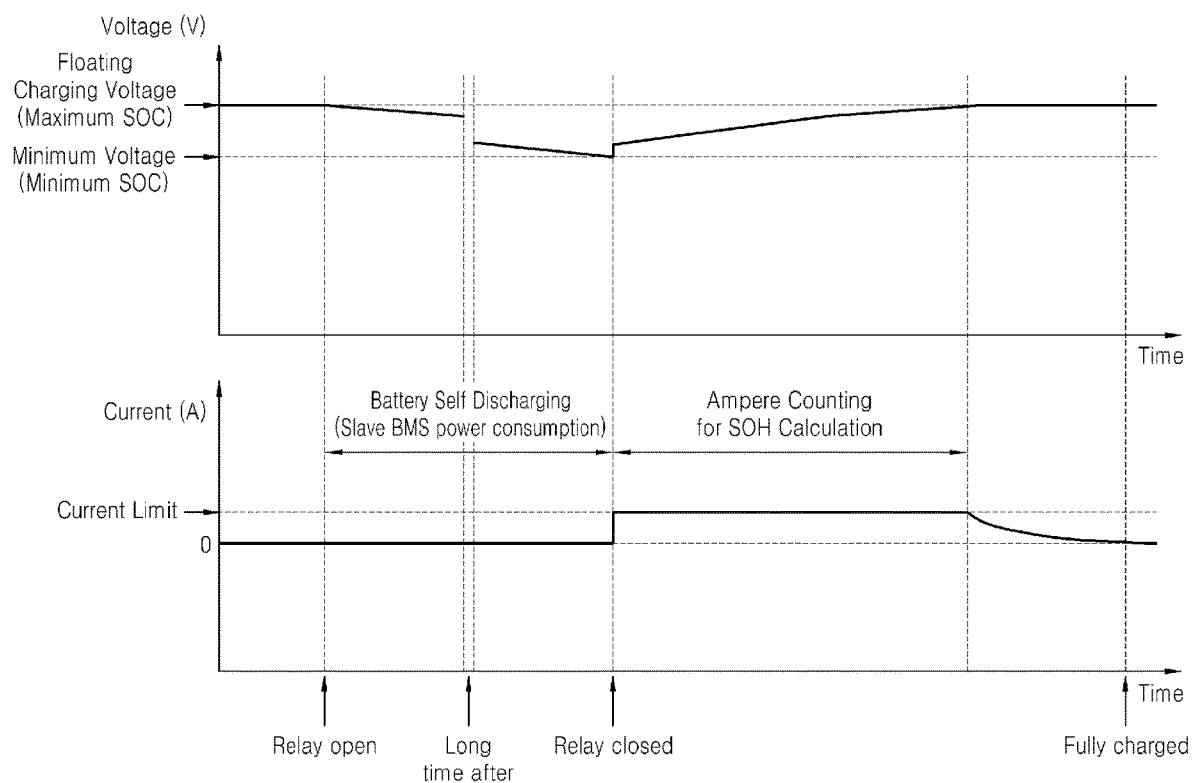
FIG. 7 is a graph showing changes in voltage and current by a control of a UPS battery aging state calculation system according to an embodiment of the present disclosure.

Also, referring to FIG. 7, it is seen that the voltage and current vary according to the method of driving the UPS battery aging state calculation system 500.

FIG. 7 is a graph showing changes in voltage and current by a control of a UPS battery aging state calculation system according to an embodiment of the present disclosure.

Referring to FIG. 7, charge is first executed and the battery is in a full charge state. Then, the switch 520 is turned off and self-discharge is started. At this time, since the SOC is the maximum value, the voltage is also the voltage value of the floating charge state. In addition, the current value at this time is 0 because the switch is off.

If the SOC is less than the predetermined discharge reference value after a predetermined discharge time, the switch 520 is turned on and the voltage becomes a minimum voltage value.

When the switch 520 is turned on and the current flows, the voltage and the SOC gradually increase, and a value of a limit current flowing in the battery is accumulated until the full charge state is reached. The graph here represents the case of accumulating the current at charge.

Therefore, the switch 520 changes the voltage and current of the UPS battery in a floating charge state to enable the SOH calculation in the UPS battery.

According to an embodiment of present disclosure, the UPS battery aging state calculation method and system configure a switch between a voltage supply source and a battery to enable a charge and discharge control and repeat a charge and discharge execution to calculate an SOH, thereby calculating an accurate aging state of a UPS battery by itself.

Although the aging state calculation method and system have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. A method of calculating a State of Health (SOH) of a battery included in an Uninterruptible Power Supply (UPS), the method comprising:
    controlling, by a control unit, repeated charge and discharge cycles of the battery, each charge and discharge cycle including a charge portion and a discharge portion;
    for each charge and discharge cycle of the battery, measuring, by the control unit, each of a current, a voltage, and a temperature;
    determining, by the control unit, whether the number of repeated charge and discharge cycles exceeds a predetermined value; and
    continuing, by the control unit, the repeated charge and discharge cycles of the battery until the number of repeated charge and discharge cycles exceeds the predetermined value;
    upon the number of charge and discharge cycles exceeding the predetermined value, calculating, by the control unit, the SOH of the battery based at least in part on (i) an initial battery capacity, (ii) a change amount of a State of Charge (SOC) of the battery during each charge portion or during each discharge portion of the repeated charge and discharge cycles, and (iii) a current amount accumulated during each charge portion or during each discharge portion of the repeated charge and discharge cycles.

2. The method of claim 1, wherein controlling repeated charge and discharge cycles of the battery comprises:
    controlling, by the control unit, charge of the battery during the charge portion until a full charge state is reached; and
    controlling, by the control unit, discharge of the battery during the discharge portion in response to the battery being fully charged.

3. The method of claim 2, wherein controlling charge of the battery during the charge portion until a full charge state is reached comprises:
    controlling, by the control unit, a switch to supply current from a current supply unit to the battery;
    calculating, by the control unit, a charge SOC based on the measured current, voltage, and temperature; and
    comparing, by the control unit, the charge SOC to a full charge reference value.

4. The method of claim 3, wherein controlling discharge of the battery during the discharge portion is initiated in response to the charge SOC being greater than the full charge reference value.

5. The method of claim 2, wherein controlling discharge of the battery comprises:
    controlling, by the control unit, a current supply switch to cut off current from the current supply to the battery when the battery is fully charged;
    calculating, by the control unit, a discharge SOC based on the measured current, voltage, and temperature during discharge of the battery; and
    comparing, by the control unit, the discharge SOC to a predetermined discharge reference value.

6. The method of claim 5, wherein controlling discharge of the battery during the discharge portion further comprises:
    determining that the discharge SOC is less than the predetermined discharge reference value;
    in response to determining that the discharge SOC is less than the predetermined discharge reference value, accumulating one of a charged current or a discharged current.

7. The method of claim 1, wherein either:
    the SOH of the battery based at least in part on (i) an initial battery capacity, (ii) a change amount of a State of Charge (SOC) of the battery during each charge portion of the repeated charge and discharge cycles, and (iii) a current amount accumulated during each charge portion of the repeated charge and discharge cycles; or
    the SOH of the battery based at least in part on (i) an initial battery capacity, (ii) a change amount of a State of Charge (SOC) of the battery during each discharge portion of the repeated charge and discharge cycles, and (iii) a current amount accumulated during each discharge portion of the repeated charge and discharge cycles.

8. The method of claim 7, further comprising individually summing each charged current accumulated for each charge portion or individually summing each discharged current accumulated for each discharge portion, wherein the change amount of the State of Charge (SOC) during each charge portion of the repeated charge and discharge cycles is the summed charged currents, and wherein the change amount of the State of Charge (SOC) during each discharge portion of the repeated charge and discharge cycles is the summed discharged currents.

* * * * *